(12) United States Patent
Brist et al.

(10) Patent No.: US 7,691,458 B2
(45) Date of Patent: Apr. 6, 2010

(54) CARRIER SUBSTRATE WITH A THERMOCHROMATIC COATING

(75) Inventors: Gary A. Brist, Yamhill, OR (US); Patrick D. Boyd, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/816,132

(22) Filed: Mar. 31, 2004

(65) Prior Publication Data

US 2005/0221066 A1 Oct. 6, 2005

(51) Int. Cl.
*C09K 19/00* (2006.01)

(52) U.S. Cl. .................. 428/1.3; 428/209; 428/901; 428/913; 428/920; 340/531; 340/532; 345/101

(58) Field of Classification Search .............. 428/209, 428/195.1, 1.3, 901, 913, 920; 340/531, 340/532; 345/101
See application file for complete search history.

(56) References Cited

U.S. PATENT DOCUMENTS

| | | | |
|---|---|---|---|
| 3,889,053 A | | 6/1975 | Lloyd et al. |
| 4,702,564 A | | 10/1987 | Parker et al. |
| 4,838,664 A | | 6/1989 | Graham |
| 4,891,250 A | * | 1/1990 | Weibe et al. ............ 374/162 |
| 4,922,242 A | * | 5/1990 | Parker .................... 345/106 |
| 5,649,766 A | | 7/1997 | Blake et al. |
| 6,229,514 B1 | * | 5/2001 | Larson ................... 345/101 |
| 6,281,165 B1 | * | 8/2001 | Cranford ................ 503/226 |
| 6,616,190 B1 | | 9/2003 | Jotcham |
| 6,872,453 B2 | * | 3/2005 | Arnaud et al. ........... 428/432 |
| 6,880,396 B2 | * | 4/2005 | Rait ....................... 73/295 |

FOREIGN PATENT DOCUMENTS

EP 0 252 753 A 1/1988

OTHER PUBLICATIONS

Pacer, (University of Rhode Island) "*Scientists develop heat-sensitive materials that change color when hot*", (downloaded Aug. 13, 2004—2 pgs.) http://www.advance.uri.edu/pacer/september2002/story8.htm.
Matt Guzy, "*Transformers Action Figures*", About->Action Figure Collecting. (downloaded Aug. 13, 2004—3 pgs.) http://www.actionfigures.about.com/library/stuff/ucmatt-tf.htm.
J. Homola, "*Color-Changing Inks—Brighten your bottom line*", for Screen Printing Magazine, Inks & Coatings Channel Sponsored by: Nazdar (downloaded Aug. 13, 2004—5 pgs.) http://www.screenweb.com/inks/cont/brighten981119.html.

(Continued)

*Primary Examiner*—Cathy Lam
(74) *Attorney, Agent, or Firm*—Blakely, Sokoloff, Taylor & Zafman LLP

(57) ABSTRACT

Numerous embodiments of a carrier substrate having thermochromatic materials are described. In one embodiment of the present invention, a carrier substrate has a visible surface, and a thermochromatic material is disposed near the carrier substrate. The thermochromatic material produces a visual change of the visible surface when an activation temperature of the thermochromatic material is reached.

32 Claims, 5 Drawing Sheets

OTHER PUBLICATIONS

Ricky James, "*Japanese Polymer Mimics Octopus Color-Changing Camouflage*", SCiScoop exploring tomorrow, posted Jan. 11, 2003 (downloaded Aug. 13, 2004—2 pgs.) http://www.sciscoop.com/story/2003/1/11/12189/6262.

Liu, J.; Enzelberger, M.; Quake, S.;"Electrophoresis", vol. 23, 2002, pp. 1531-1536, XP002332356.

International Search Report for PCT/US2005/010530 mailed Jul. 15, 2005, 5 pages.

Chapter I International Preliminary Report on Patentability (IPRP Chapter I) for PCT/US2005/010530, Mailed Oct. 12, 2006 (8 pages).

* cited by examiner

CARRIER SUBSTRATE WITH A THERMOCHROMATIC COATING

TECHNICAL FIELD

Embodiments of the present invention relate to the field of semiconductor processing and the fabrication of integrated circuits.

BACKGROUND

Electronic manufacturers use printed substrates to connect integrated circuits (ICs) electrically, and other electrical components such as capacitors and resistors. ICs are made up of electronic components linked together by conductive connections to form one or more functional circuits. A substrate is a relatively flat and rigid structure that provides mechanical support for a die in the IC package, transmits signals to and from the IC, and can also transfer heat that is generated during the operation of the IC. The IC package may be applied to a circuit board assembly that includes systems of interconnected IC packages to form an electronic device such as a computer or a cellular phone.

Printed circuit boards (PCBs) are one type of printed substrates which typically include a number of electrical and non-electrical layers. For example, the electrical layers may include copper traces that serve as routing nets between components attached to the PCB, and layers that serve as connections to power and ground. Fiberglass or epoxy resin dielectric materials are used to separate each of the layers.

A coating referred to as solder mask is placed on the top and/or bottom of the PCB to prevent solder from flowing freely on the board, and typically has a green color. PCBs also include silkscreen layers for documentation. For example, reference designators and other text are printed on the top and/or bottom of a PCB using a process similar to that used for printing t-shirts.

One problem with carrier substrates such as PCBs is that thermal differentials on the board are not easily detectable. Thermal differential patterns on particular areas of a PCB may provide useful diagnostic information. Current methods require thermal differentials to be assessed with off-line equipment or thermal sensors placed across the surface of the PCB.

BRIEF DESCRIPTION OF THE DRAWINGS

Embodiments of the present invention are illustrated by way of example, and not limitation, in the figures of the accompanying drawings in which.

DETAILED DESCRIPTION

Figure 1:
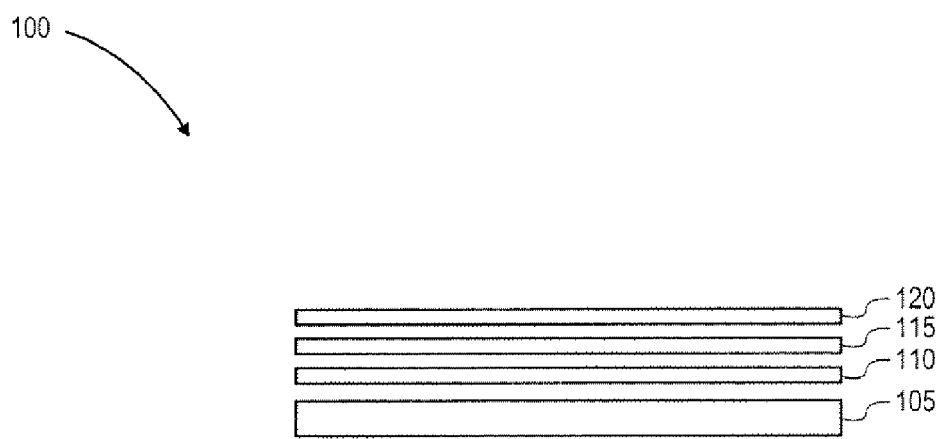
FIG. 1 illustrates a cross-sectional side view of one embodiment of carrier substrate with a layer of thermochromatic material.

In the following description, numerous specific details are set forth such as examples of specific materials or components in order to provide a thorough understanding of embodiments of the present invention. It will be apparent, however, to one skilled in the art that these specific details need not be employed to practice embodiments of the present invention. In other instances, well known components or methods have not been described in detail in order to avoid unnecessarily obscuring embodiments of the present invention.

The terms "on," "above," "below," "between," "adjacent," and "near" as used herein refer to a relative position of one layer or element with respect to other layers or elements. As such, a first element disposed on, above or below another element may be directly in contact with the first element or may have one or more intervening elements. Moreover, one element disposed next to or adjacent another element may be directly in contact with the first element or may have one or more intervening elements.

Any reference in the specification to "one embodiment" or "an embodiment" means that a particular feature, structure, or characteristic described in connection with the embodiment is included in at least one embodiment of the claimed subject matter. The appearances of the phrase, "in one embodiment" in various places in the specification are not necessarily all referring to the same embodiment.

Embodiments of a carrier substrate such as a printed circuit board (PCB) are described that supports integrated circuits (ICs) and their associated interconnect lines, ground planes, and power planes. In one embodiment, the PCB includes signal layers of copper interconnects formed on the upper and/or lower surfaces of the PCB. Between the upper and lower surfaces of the PCB may be a copper ground plane that is electrically isolated from the upper and lower signal layers by fiberglass boards. Additional signal layers, ground planes, and power planes may also be included in the PCB between the upper and lower surfaces, each electrically isolated from one another by fiberglass boards. Insulating layers such as solder mask layers may also be included near the upper and lower surfaces of the PCB.

In one embodiment of the present invention, the PCB may be coated with a layer or multiple layers of thermochromatic materials. Any rise in temperature of the PCB above an activation threshold of the thermochromatic materials results in a visual change on the surface of the PCB. Such color change may result from the thermochromatic material changing from a first color to a second color, or from the thermochromatic material becoming transparent or translucent to reveal an underlayer or identification marking associated with the PCB. The use of thermochromatic materials provides the advantage of visualizing thermal differentials on the PCB, such as the effect of elevated temperature from attached components on the surrounding surface of the PCB, or from inefficient cooling patterns within the chassis that contains the PCB (e.g., the motherboard of computer system).

For clarity of explanation, embodiments of the present invention herein are described with respect to disposing thermochromatic materials on a PCB. However, it may be appreciated that embodiments described herein may be applicable for other types of carrier substrates including, but not limited to, motherboards, daughter cards, controller boards, video adapters, and network interface cards.

FIG. 1 illustrates a cross-sectional side view of a PCB 100 having an upper signal layer 110, which may include electrical interconnects, disposed above dielectric layer 105 which electrically separates signal layer 110 from a ground plane (not shown). Dielectric layer 105 also electrically separates signal layer 110 from other ground planes, signal layers, and power planes that may additionally be formed below dielectric layer 105. One or more electrical components may be coupled to signal layer 110 such as processors, chipset, and voltage regulation components.

A solder mask layer 115 is disposed above signal layer 110, and a thermochromatic layer or material 120 is disposed above solder mask layer 115. The thermochromatic material (e.g., inks or dyes) may be selected to change from a first color to a second color at a specific activation temperature. Alternatively, the thermochromatic inks may be selected to become translucent or transparent at a particular activation temperature. In other words, the visible surface of PCB 100 may include a thermochromatic material that changes the visible surface from a first visible state to a second visible state by changing from a first color to a second color at a chosen or selected temperature. Alternatively, the thermochromatic material may become transparent at a selected activation temperature to reveal an underlying color or surface. The combination of the thermochromatic materials disposed near or above solder mask layer 115 may also be customized to reveal an identification character, label, number, symbol, or logo printed on solder mask layer 115, or another layer disposed below thermochromatic material 120, or above thermochromatic material 120.

In one embodiment, the thermochromatic markings and layers may be one of various thermochromatic dyes and inks including, but not limited to, leucodyes, N-isoproplyacrylamide ("NIPAM"), thermochromatic liquid crystals, and other color changing inks known in the art. Leucodyes and NIPAM change from a first color to a transparent state at a selected activation temperature. NIPAM is a polymer which functionally simulates the color changing capabilities of octopus skin. In one embodiment, a temperature change of about 3° F. to about 6° F. may activate a change from a colored state to a transparent state for leucodyes printed on solder mask layer 115.

Thermochromatic liquid crystals are a class of crystals in which the atoms are ordered in a particular manner that gives the crystals unique chromatic properties. When heated, the atom/molecules arrange to a particular configuration that causes the molecules to interact with light in a different way (i.e., change color). Thermochromatic liquid crystals may be selected to change from a first color to a second color at a particular activation temperature, for example, above or within a temperature range that is practical for the generation of a second color. In one embodiment, thermochromatic liquid crystal inks may be formulated to activate a color change (i.e., visual change) with temperature changes of less than 1° F. In one embodiment, the range in which thermochromatic materials of PCB 100 may be activated may be between about 30° F. to about 200° F. Activation temperatures for thermochromatic dyes, inks, or materials are known in the art, as such, a detailed description is not provided herein. The thermochromatic materials may be applied to PCB 100 by a screen-printing or similar printing process. Other processes for applying the thermochromatic materials include dipping, painting, spraying, and other techniques known in the art.

In an alternative embodiment, identification markings and locator markings for components coupled to PCB 100 may be screen printed with a thermochromatic material. These identification markings and locator markings may be printed above or below solder mask layer 115. Components that may be coupled to PCB 100 include, but are not limited to, processor, chipsets, graphic chips, and voltage regulation components.

Figure 2A:
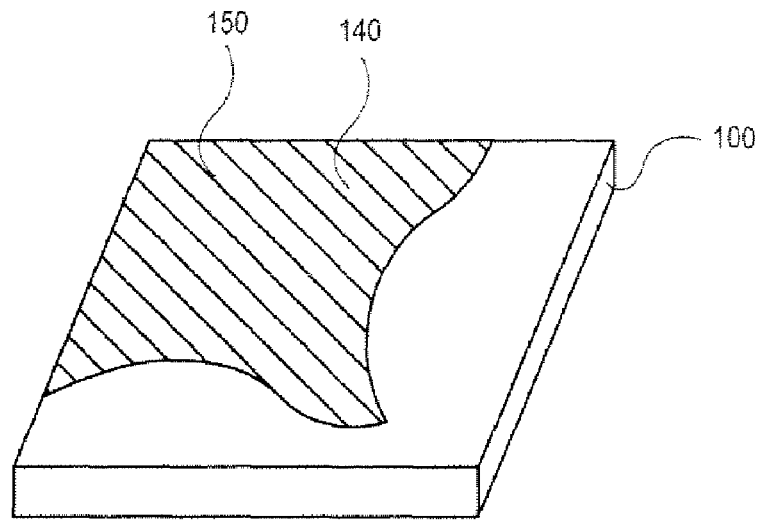
FIGS. 2A-2B illustrate one embodiment of the progression of changing a visible surface of a carrier substrate from a first visible state to a second visible state.
Figure 2B:
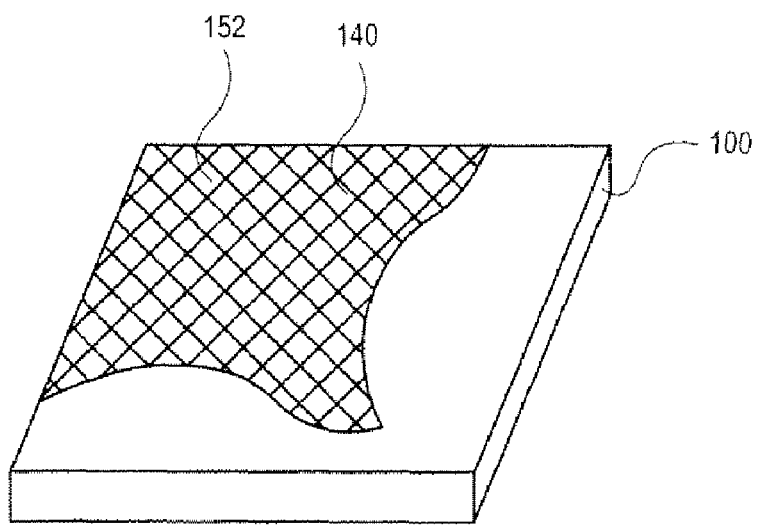

FIGS. 2A-2B illustrate one embodiment of the progression of changing a visible surface of PCB 100 (as described above with respect to FIG. 1) from a first visible state to a second visible state. FIG. 2A illustrates a visible surface 140 disposed above PCB 100. Visible surface 140 is represented as partially covering PCB 100 for clarity of distinction with respect to PCB 100, although in alternative embodiments, visible surface 140 may cover the entire or smaller portions of the surface of PCB 100. Visible surface 140 has a first color 150, and this first color may be from the color of thermochromatic material 120, the color of solder mask layer 115, or the color of any other layer of PCB 100 not covered by an opaque surface or material. In one embodiment, visible surface 140 may be the result of a thermochromatic liquid crystal disposed over solder mask layer 115 to produce first color 150. As the temperature of PCB 100 increases to a particular activation temperature of the thermochromatic liquid crystal, first color 150 changes to a second color 152, as illustrated in FIG. 2B. The activation temperature may be selected to be above normal operating temperatures for PCB 100. For example, the activation temperature to trigger the color change may be selected to visualize areas of PCB 100 that are dissipating heat from components coupled to PCB 100. Visual changes on PCB 100 may also provide information about the cooling efficiency of PCB 100 contained in a chassis. For example, fans disposed within a chassis may not uniformly dissipate heat from PCB 100, which may be reflected in the color changes in portions of PCB 100.

By changing the color of visible surface 140 from a first color to a second color thermochromatically (i.e., from a first visible state to a second visible state), temperature elevations may easily be detected through direct visualization. For example, a change in the visible surface 140 from green to red may indicate increased temperature levels in certain portions of PCB 100.

Figure 3A:
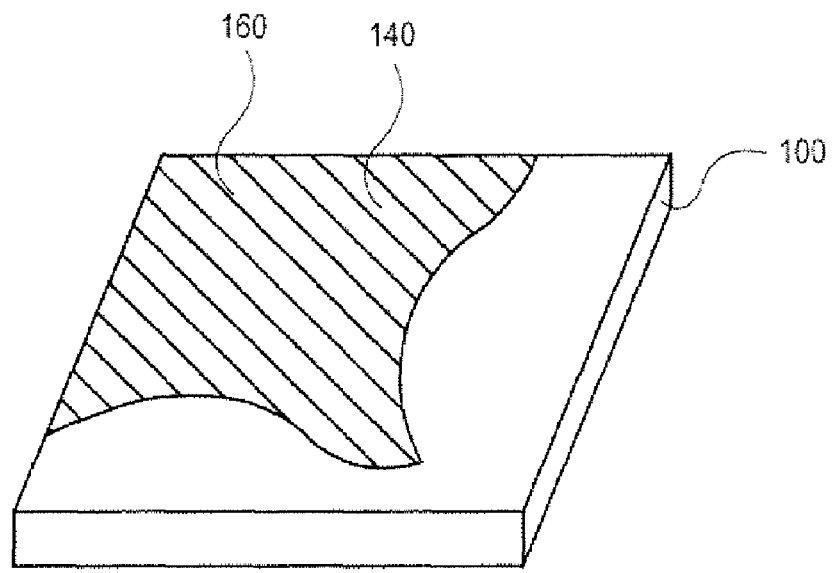
FIGS. 3A-3B illustrate another embodiment of the progression of changing a visible surface of a carrier substrate from a first visible state to a second visible state.
Figure 3B:
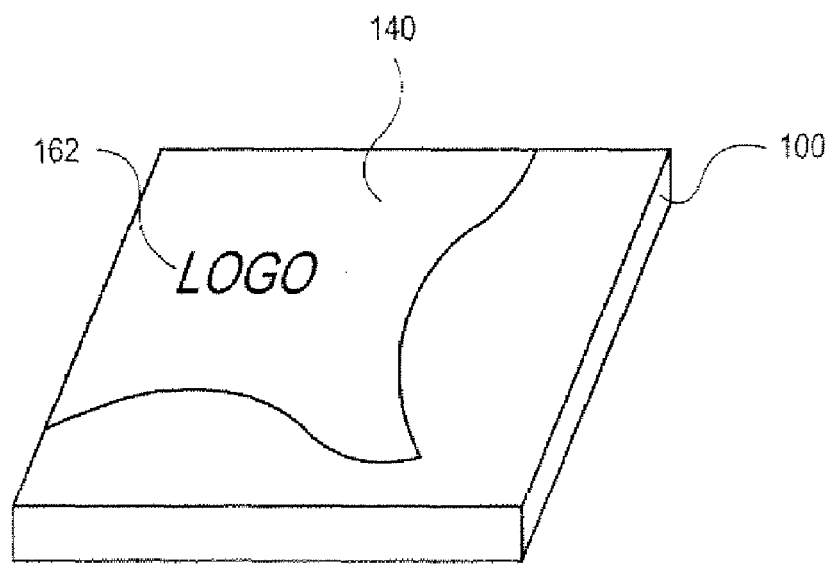

FIGS. 3A-3B illustrate an alternative embodiment of the progression of changing a visible surface of PCB 100 (as described above with respect to FIG. 1) from a first visible state to a second visible state. FIG. 3A illustrates a visible surface 140 disposed above PCB 100 having a first color 160. Visible surface 140 has a first color 160, and this first color may be from the color of thermochromatic material 120, the color of solder mask layer 115, or the color of any other layer of PCB 100 not covered by an opaque surface or material. In one embodiment, visible surface 140 may be the result of leucodye or NIPAM disposed over solder mask layer 115 to produce first color 160. As the temperature of PCB increases to a particular activation temperature of the leucodye or NIPAM, visible surface 140 becomes transparent to reveal a marking (represented by "LOGO" 162) printed on solder mask layer 115, as illustrated in FIG. 3B. Marking 162 may be a product identifier for PCB 100 or other types of informational markings found on carrier substrates. The use of leucodyes and NIPAM allow for the visualization of thermal differentials on PCB 100 as well as other markings on solder mask layer 115. For example, the label "HOT" may be printed on solder mask layer 115 to provide a visible warning when a temperature of PCB 100 has exceeded a certain level. Other labels or markings may also be placed on individual components coupled to PCB 100 including, but not limited to, memory chips, daughter cards, processors, etc.

Figure 4:
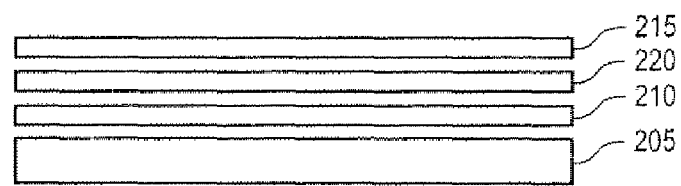
FIG. 4 illustrates a cross-sectional side view of an alternative embodiment of carrier substrate with a layer of thermochromatic material.

FIG. 4 illustrates a cross-sectional side view of an alternative embodiment of PCB 200 with a layer 220 of thermochromatic material disposed below a solder mask layer 215 and above dielectric layer 205 and signal layer 210. In one embodiment of the present invention, the thermochromatic material of layer 220 may have similar properties to that of solder mask layer 215 (i.e., insulating properties). PCB 200 may be applicable for use with a solder mask that is transparent such that a visible surface of PCB 200 has a color based on a first color of thermochromatic layer 220. Thermochromatic layer 220 may include a color changing ink such as liquid crystal or a type of ink that becomes transparent at a selected activation temperature. The change from a first visible state to a second visible state may be used to signal temperature differentials on PCB 200 as discussed above with respect to PCB 100.

Figure 5:
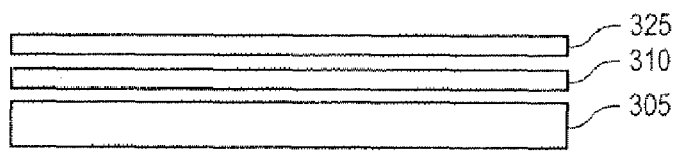
FIG. 5 illustrates a cross-sectional side view of another embodiment of carrier substrate with a layer of thermochromatic material.

FIG. 5 illustrates a cross-sectional side view of another embodiment of PCB 300 having a layer 325 of thermochromatic material that may be mixed with solder mask material to be a substitute for the solder mask material (e.g., have solder mask properties) to form a single layer disposed above signal layer 310 and dielectric layer 305. In one embodiment, the thermochromatic material may be a liquid crystal to give the perception of the visible surface (i.e., solder mask) changing from a first color to a second color. Alternatively, the thermochromatic material of layer 325 may be leucodye or NIPAM that also produces a color change. For example, a black leucodye may be mixed with a green solder mask material to give a visible surface of PCB 300 a mixed color. When PCB is heated to a selected activation temperature, the black leucodye becomes transparent, which results in the visible surface of the solder mask layer having its original green color. By formulating the solder mask material with the thermochromatic material, fewer layers are required to provide visual temperature differentials for PCB 300.

Figure 6:
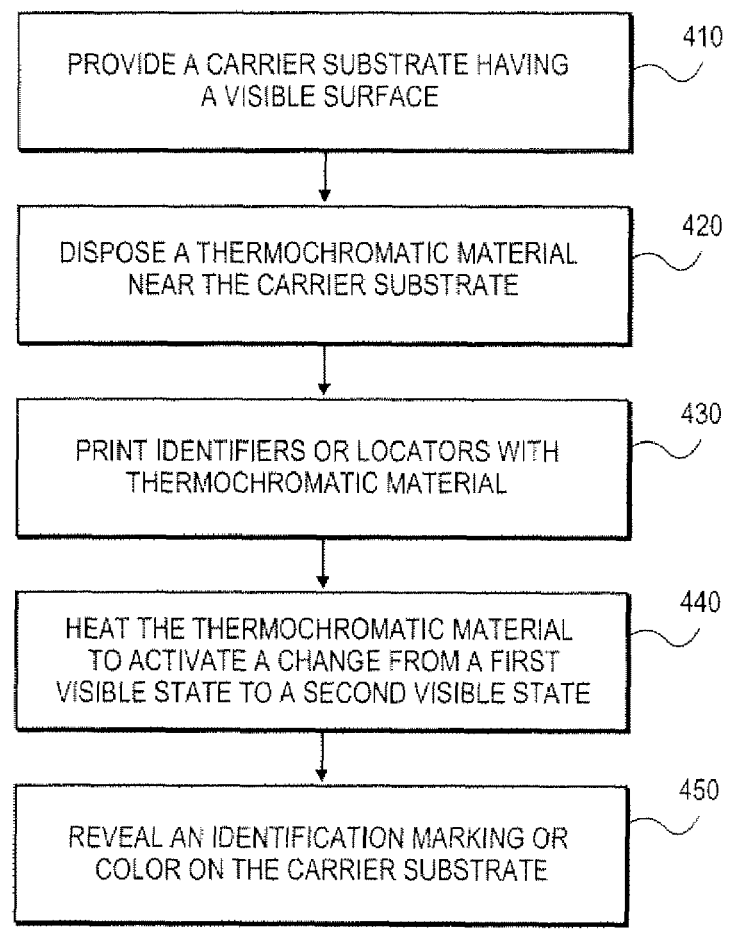
FIG. 6 illustrates one method for visually detecting thermal differentials on a carrier substrate.

FIG. 6 illustrates one method for visually detecting thermal differentials on a carrier substrate. Generating changes in visible states for the PCB may be correlated with temperature differentials and fluctuations that may be useful in providing diagnostic and identification procedures. A carrier substrate, for example a PCB, having a visible surface is provided, block 410. The visible surface may be a top layer of a solder mask material (e.g., solder mask 115) or other exposed layers on the PCB (e.g., PCBs 100, 200). A thermochromatic material is disposed near the carrier substrate, block 420. In one embodiment, the thermochromatic material may be a layer disposed above the solder mask layer. Alternatively, the thermochromatic material may be disposed below the solder mask layer, or formulated within the solder mask layer. The thermochromatic material may be one or a combination of color changing inks known in the art, including but not limited to, leucodyes, NIPAM, and liquid crystal. Whatever thermochromatic material is chosen, it may be formulated to trigger a color change at a selected or desired temperature. For example, a temperature may be selected to visualize areas of PCB that are dissipating heat from components coupled to PCB, or temperature differentials as a result of inefficient heat dissipation from a chassis containing the PCB. In an alternative embodiment, identifiers and locators for components coupled to the PCB may be screen printed with thermochromatic materials, block 430. Components that may be coupled to PCB 100 include, but is not limited to, processor, chipsets, graphic chips, and voltage regulation components.

When the carrier substrate becomes heated to or above the selected activation temperature, the thermochromatic material changes from a first visible state to a second visible state, block 440. In one embodiment, the thermochromatic material may be part of a visible surface of the carrier substrate (e.g., top solder mask layer) having a first color. The thermochromatic material causes a change in the color of the visible surface from the first color to a second color. Alternatively, the change may be from a first color to a transparent state. The change to a known second color may be associated with increased temperature levels on the carrier substrate possibly caused by electrical components coupled to the carrier substrate. The change to a transparent state may also reveal identification markings, underlying colors, or other labels printed on layers disposed below the thermochromatic material (e.g., solder mask layer), block 450.

In the foregoing specification, the invention has been described with reference to specific exemplary embodiments thereof. It will, however, be evident that various modifications and changes may be made thereto without departing from the broader spirit and scope of embodiments of the invention as set forth in the appended claims. The specification and figures are, accordingly, to be regarded in an illustrative rather than a restrictive sense.

What is claimed is:

1. An apparatus, comprising:
a carrier substrate having a visible surface and a heat generating component electrically coupled to the carrier substrate;
a thermochromatic material having an activation temperature, disposed adjacent to the carrier substrate, wherein the thermochromatic material produces a visual change of the visible surface when the activation temperature of the thermochromatic material is reached; and
a solder mask layer, wherein the solder mask layer is transparent and overlaying the thermochromatic material adjacent to the carrier substrate,
wherein the carrier substrate coupled to the heat generating component has normal operating temperatures when the carrier substrate and heat generating component operate normally, and
wherein the thermochromatic material is selected to have its activation temperature above the normal operating temperatures of the carrier substrate coupled to the heat generating component;
wherein said thermochromatic material comprises a material selected from the group consisting of leucodye and N-isopropylacrylamide to change from a first color and a second color.

2. The apparatus of claim 1, wherein the carrier substrate comprises a printed circuit board.

3. The apparatus of claim 1, wherein the solder mask material has similar properties to that of the thermochromatic material.

4. The apparatus of claim 1, wherein the thermochromatic material comprises a leucodye to change from said first color to said transparent state.

5. The apparatus of claim 1, wherein the thermochromatic material comprises N-isopropylacrylamide to change from said first color to said transparent state.

6. The apparatus of claim 1, wherein the thermochromatic material further comprises a liquid crystal to change from a first color to a second color.

7. The apparatus of claim 1, wherein the thermochromatic material is integrated with the solder mask.

8. The apparatus of claim 1, wherein the carrier substrate comprises a signal layer electrically coupled to the heat generating component and wherein the solder mask material and the thermochromatic material are mixed to form a single mixed layer above the signal layer.

9. The apparatus of claim 1, wherein the carrier substrate further comprises component identification markings printed on the carrier substrate with the thermochromatic material underlying the solder mask layer.

10. A printed circuit board, comprising:
   a signal layer electrically coupled to a heat generating component;
   a solder mask layer disposed above the signal layer, wherein the solder mask layer is transparent; and
   a thermochromatic material disposed over the signal layer and under the solder mask layer, wherein the thermochromatic layer has an activation temperature to change a visible surface of the printed circuit board from a first visible state to a second visible state,
   wherein the printed circuit board has normal operating temperatures when the printed circuit board operates normally, and
   wherein the thermochromatic material is selected to have its activation temperature above the normal operating temperatures of the printed circuit board;
   wherein said thermochromatic material comprises a material selected from the group consisting of leucodye and N-isopropylacrylamide.

11. The printed circuit board of claim 10, wherein the first visible state comprises a first color and the second visible state comprises a second color.

12. The printed circuit board of claim 11, wherein the thermochromatic material further comprises a liquid crystal material.

13. The printed circuit board of claim 10, further comprising identification marking printed on the substrate with thermochromatic material.

14. The printed circuit board of claim 10, wherein the thermochromatic material comprises a leucodye material.

15. The printed circuit board of claim 10, wherein the thermochromatic material comprises N-isopropylacrylamide.

16. The printed circuit board of claim 10, wherein the solder mask material and the thermochromatic material are mixed into a single mixed layer above the signal layer.

17. The printed circuit board of claim 10, wherein the thermochromatic material and the solder mask material have similar physical properties.

18. The printed circuit board of claim 17, wherein the thermochromatic material is integrated with the solder mask layer.

19. A detection apparatus, comprising:
   a carrier substrate having a visible surface;
   a heat generating component electrically coupled to the carrier substrate;
   a thermochromatic material, adjacent the carrier substrate, for detecting heat from the component, which is in excess of normal operating conditions; and
   a solder mask layer, wherein the solder mask layer is transparent and overlaying the thermochromatic material adjacent the carrier substrate,
   wherein the carrier substrate electrically coupled to the heat generating component has normal operating temperatures when the substrate and the heat generating component operate normally, and
   wherein the thermochromatic material is selected to have an activation temperature above the normal operating temperatures of the carrier substrate coupled to the heat generating component, and
   wherein the thermochromatic material provides a visual thermal differential of those areas on the carrier substrate electrically coupled to the heat generating component with temperatures above its normal operating temperatures;
   wherein said thermochromatic material comprises a material selected from the group consisting of leucodye and N-isopropylacrylamide.

20. The detection apparatus of claim 19, wherein the carrier substrate is selected from the group consisting of: printed circuit boards (PCB), motherboards, daughterboards, controller boards, video adapters, and network interface cards.

21. The detection apparatus of claim 19, wherein the heat generating component is selected from the group consisting of: processors, chipsets, graphic chips, voltage regulator components, and any combination thereof.

22. The detection apparatus of claim 19, wherein the activation temperature is between about 30° F. and about 200° F.

23. The detection apparatus of claim 19, wherein the visual thermal differential is useful in providing diagnostic and identification procedures.

24. The detection apparatus of claim 23, wherein the visual thermal differential is useful for identifying inefficient heat dissipation.

25. The detection apparatus of claim 23, wherein the visual thermal differential is useful for identifying the elevated temperature of a defective component coupled to the carrier substrate.

26. The detection apparatus of claim 19, wherein the thermochromatic material comprises a combination of color changing inks.

27. The detection apparatus of claim 19, wherein the solder mask material is part of the visible surface.

28. The detection apparatus of claim 27, wherein the solder mask material has similar properties to that of the thermochromatic material.

29. The detection apparatus of claim 27, wherein the carrier substrate comprises a signal layer electrically coupled to the heat generating component, and wherein the solder mask material and the thermochromatic material are mixed to form a single layer above a signal layer.

30. A diagnostic detection apparatus, comprising:
   a heat generating component electrically coupled to a carrier substrate having a signal layer, wherein the carrier substrate electrically coupled to the heat generating component has normal operating temperatures when the carrier substrate and heat generating component operate normally;
   a thermochromatic material above the heat generating component and under a solder layer, wherein the thermochromatic material is selected to have an activation temperature above the normal operating temperatures of the carrier substrate coupled to the heat generating component; and
   wherein said thermochromatic material comprises a material selected from the group consisting of leucodye and N-isopropylacrylamide.

31. The diagnostic detection apparatus of claim 30, wherein the solder mask layer further comprises thermochromatic material mixed into the solder mask material and having an activation temperature above the normal operating temperature of the heat generating component electrically coupled to the substrate.

32. The diagnostic detection apparatus of claim 30, wherein the carrier substrate is selected from the group consisting of: printed circuit boards (PCB), motherboards, daughterboards, controller boards, video adapters, and network interface cards.

* * * * *